United States Patent [19]
Parkhe et al.

[11] Patent Number: 5,886,865
[45] Date of Patent: Mar. 23, 1999

[54] METHOD AND APPARATUS FOR PREDICTING FAILURE OF AN ELETROSTATIC CHUCK

[75] Inventors: Vijay D. Parkhe, Sunnyvale; Steven Sansoni; Vincent E. Burkhart, both of San Jose, all of Calif.

[73] Assignee: Applied Materials, Inc., Santa Clara, Calif.

[21] Appl. No.: 42,972

[22] Filed: Mar. 17, 1998

[51] Int. Cl.$^6$ .................................................. H02N 13/00
[52] U.S. Cl. ............................ 361/234; 361/233; 279/128
[58] Field of Search ..................................... 361/230–235; 279/128; 340/679, 635

[56] References Cited

U.S. PATENT DOCUMENTS

| | | | |
|---|---|---|---|
| 5,103,367 | 4/1992 | Horwitz et al. ........................ | 361/234 |
| 5,117,121 | 5/1992 | Watanabe et al. ...................... | 307/130 |
| 5,221,450 | 6/1993 | Hattori et al. ....................... | 204/192.32 |
| 5,436,790 | 7/1995 | Blake et al. ........................... | 361/234 |
| 5,444,597 | 8/1995 | Blake et al. ........................... | 361/234 |
| 5,463,526 | 10/1995 | Mundt .................................... | 361/234 |
| 5,507,874 | 4/1996 | Su et al. ................................ | 134/1 |
| 5,557,215 | 9/1996 | Saeki et al. ........................ | 204/298.31 |
| 5,671,119 | 9/1997 | Huang et al. ........................... | 361/234 |
| 5,699,223 | 12/1997 | Mashiro et al. ........................ | 361/234 |
| 5,712,702 | 1/1998 | McGahay et al. ....................... | 356/311 |
| 5,751,537 | 5/1998 | Kumar et al. ........................... | 361/234 |

*Primary Examiner*—Fritz Fleming
*Attorney, Agent, or Firm*—Thomason & Moser

[57] ABSTRACT

A method and apparatus for determining the state of contamination of an electrostatic chuck. The method consists of applying a voltage to at least one of the chuck electrodes and measuring a leakage current to any of the chuck electrodes. The measured current is compared to a first threshold value. If the measured current is greater than the first threshold value, the chuck is deemed contaminated.

21 Claims, 4 Drawing Sheets

METHOD AND APPARATUS FOR PREDICTING FAILURE OF AN ELETROSTATIC CHUCK

BACKGROUND OF THE DISCLOSURE

1. Background of the Invention

The invention relates to semiconductor wafer processing systems and, more particularly, to a system for failure prediction of electrostatic chucks used in semiconductor processing.

2. Description of the Background Art

Substrate support chucks are widely used to support and retain substrates (e.g., semiconductor wafers) within semiconductor processing systems. A particular type of substrate support chuck used in high temperature physical vapor deposition (PVD) systems is an electrostatic chuck or E-chuck. These chucks are used to retain semiconductor wafers, or other substrates, in a stationary position in a process chamber during processing. Such electrostatic chucks contain one or more electrodes embedded within a unitary chuck body. The chuck body is, for example, fabricated of aluminum nitride or boron nitride or alumina doped with a metal oxide such as titanium oxide or chromium oxide or some other ceramic material with similar electrical and thermal properties.

In use, a wafer rests against the support surface of the chuck body as a chucking voltage is applied to the electrodes. Because of the conductive nature of the ceramic material at high temperatures, the wafer is primarily retained against the support surface of the ceramic chuck by the Johnsen-Rahbek effect. The Johnsen-Rahbek effect establishes a small but highly effective electric current between the upper surface of the chuck and the substrate being retained. As such, charges migrate to the support surface of the chuck and the underside of the substrate resulting in the substrate being retained against the support surface of the chuck by a chucking force which is much greater than that generated by a purely Coulombic effect between the wafer and the electrodes. Johnsen-Rahbek chucks are disclosed in U.S. Pat. Nos. 5,117,121, issued May 26, 1992 and 5,463,526 issued Oct. 31, 1995.

During wafer processing, the chuck can be subject to a wide range of temperatures, typically in the range of 20° to 150° C. and possibly as high as 300° to 500° C. for some types of processes. At room temperature (approximately 20° C.), the resistivity of the chuck is on the order of $10^{14}$ ohm-cm and decreases to approximately $10^{13}$ ohm-cm at temperatures of around 150° C. This decrease in resistivity promotes a satisfactory chucking force via the Johnsen-Rahbek effect. At temperatures above about 350° C., a conductive film can form on the chucking surface as a result of exposing the chuck to carbon-containing compounds in the chamber atmosphere, e.g., seal outgassing, residual air, and the like. Such a conductive film causes a leakage current when a chucking voltage is applied to the chucking electrodes that enables the surface charge to dissipate into metallic components contacting the chuck or conduct into the wafer. At about 550° C., the leakage current can be as high as 6 milliamps, which is sufficient to cause arcing between the wafer and the chuck. If the leakage current is 10 to 15 milliamps, few charges accumulate on the chuck surface and the chucking force is drastically reduced or lost completely. If a suitable chucking force is not developed by the chuck, wafer processing can be hindered to the point that yields are reduced or entire batches of wafers are ruined. The conductive material can be cleaned from the surface of the chuck by plasma cleaning procedures. Plasma cleaning techniques that can be used to clean electrostatic chucks are disclosed in U.S. Pat. Nos. 5,221,450, issued Jun. 22, 1993 and 5,507,874, issued Apr. 16, 1996.

Wafer process chambers are equipped with system controllers which provide the necessary voltages, currents, and signals for chucking, heating, initiating cleaning sequences or controlling process sequences. Chucking voltages (in the range of 0–1000 V) are supplied by a high voltage power supply responsive to a control signal from the system controller. However, in prior art process controllers, the cleaning sequence must be initiated at the discretion of an operator. Often, the operator is unaware of the build-up of the conductive film until the leakage current has become so large as to inhibit the chuck from developing a suitable chucking force (i.e., chuck failure) by which time a batch of wafers may already be ruined.

Therefore, a need exists for a method and apparatus that informs the operator, in advance, that an electrostatic chuck is about to fail and that it is time to clean the chuck.

SUMMARY OF THE INVENTION

To overcome the disadvantages associated with the prior art, the present invention utilizes a circuit which measures the leakage current between the chuck electrodes when a chucking voltage is applied without a wafer present on the chuck. In a Johnsen-Rahbek effect chuck, a nominal leakage current is always present whether there is a wafer on the chuck or not. If the leakage current exceeds a certain threshold value that is greater than the nominal leakage current, the circuit sends a signal to the system controller which causes a display to warn the operator that it is time to clean the chuck. The threshold value is defined in terms of a critical value of a ratio of the actual leakage current to a normal leakage current. The critical value of the ratio depends on the chuck electrode configuration and the material forming the chuck body. After standard plasma cleaning, the leakage current is again measured to see if the chuck has recovered. If the leakage current is below a second threshold value, the controller sends a message to the operator that the cleaning process has been successful.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
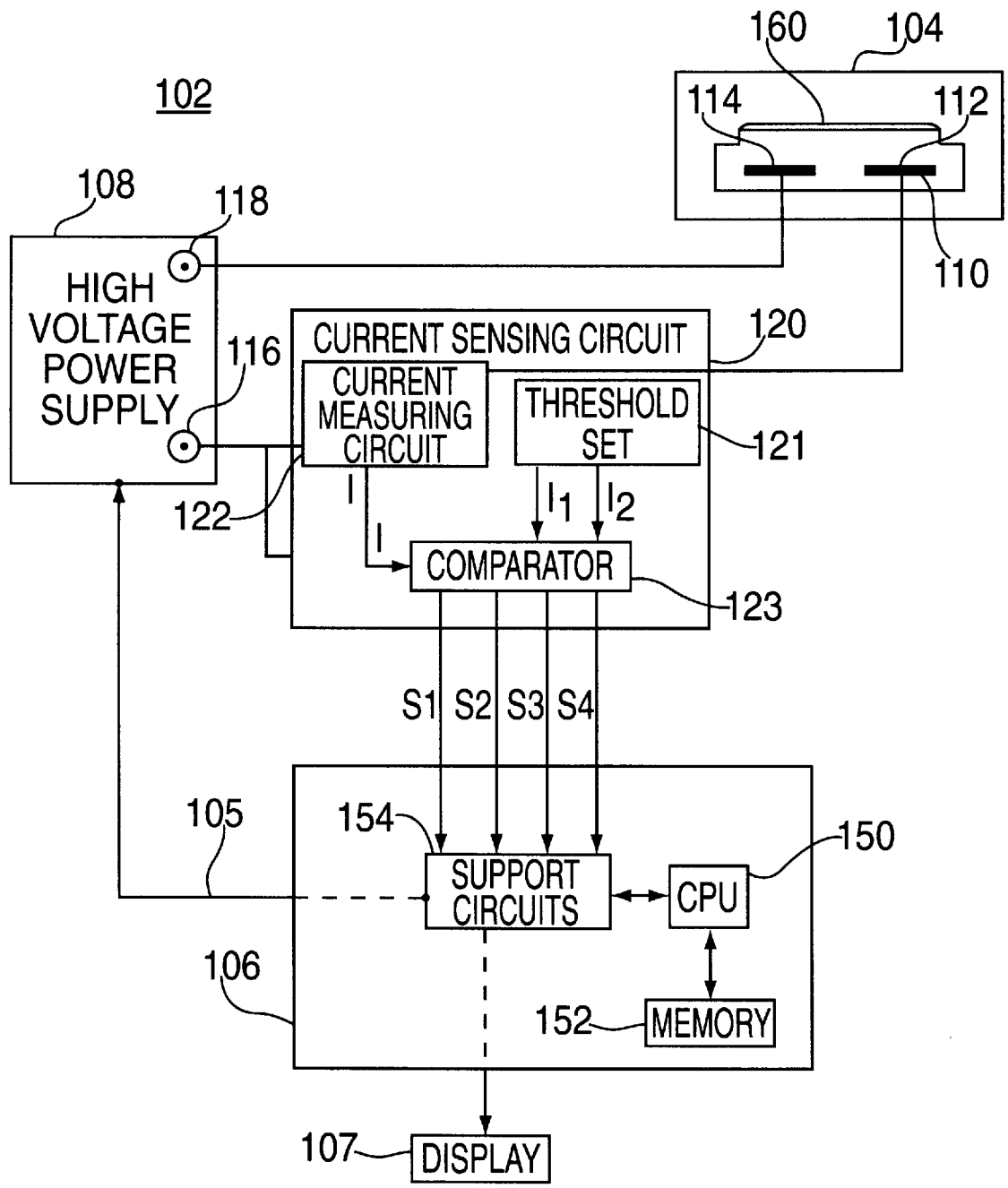
FIG. 1 depicts a block diagram of a semiconductor processing system utilizing the leakage current detector system of the present invention.

FIG. 1 depicts a block diagram of a semiconductor wafer processing system 102 according to the present invention. Semiconductor wafer processing system 102 comprises a process chamber 104, a system controller 106 and a high voltage power supply 108. The process chamber 104 can be any conventional chamber used for semiconductor wafer processing. Typical chambers are vacuum sealed and are equipped with systems for evacuation and introduction of process gases (not shown) that facilitate deposition or etching of semiconductor wafers 160.

The system controller 106 includes hardware which provides the necessary signals to initiate, regulate, and terminate the processes occurring in the process chamber 104. The system controller 106 includes a programmable central processing unit (CPU) 150 that is operable with a memory 152 and well-known support circuits 154 such as power supplies, clocks, cache, and the like. The CPU 150 forms a general purpose computer that becomes a specific purpose computer when executing programs such as the embodiment of the invention depicted in the flow diagram of FIG. 2. Although the invention is described herein as being implemented in software and executed upon a general purpose computer, those skilled in the art will realize that the invention could be implemented using hardware such as an application specific integrated circuit (ASIC) or other hardware circuitry. As such the invention should be understood as being able to be implemented, in whole or in part, in software, hardware or both.

The support circuits 154 produce a control output signal on path 105 for controlling the high voltage power supply 108 in response to CPU 150. Such a control signal could be a simple 0–10 volt analog voltage controlling a 0–1000 volt output from the power supply 108. The system controller 106 also includes hardware for monitoring the processes through sensors (not shown) in the process chamber 104. Such sensors can measure system parameters such as temperature, pressure, plasma content, chamber atmosphere, plasma voltage and current as well as electrostatic chuck voltage. Furthermore, the wafer processing system 102 includes at least one display device 107 responsive to the system controller 106 through the support circuits 154. The display device 107 displays warnings and messages in a form which can be readily understood by a human operator. The display device 107 is, for example, a graphical display that portrays system parameters and control icons upon a "touch screen" or light pen based interface.

An electrostatic chuck 110 is situated in process chamber 104 to securely retain wafers during processing. Typical electrostatic chucks have at least one electrode to which a voltage is applied to electrostatically secure a wafer to the chucking surface. In this example, the electrostatic chuck 110 is a bipolar chuck having two electrodes 112, and 114. Although a bipolar, DC chuck is depicted and discussed below, the invention may operate using any type of electrode structure and drive voltage combination that permits measurement of leakage current between electrodes or other form of contact including monopolar, bipolar, tripolar, AC, DC, interdigitated, zonal and the like.

To power the chuck 110, the high voltage power supply 108 has at least two outputs 116 and 118 which are electrically connected to the electrodes 112 and 114, respectively. The supply outputs 116 and 118 can have a floating reference (+ and −) or a ground reference (+ and ground or − and ground) depending on the design of the chuck. The voltage difference between the supply outputs 116 and 118 is controlled by system controller 106 via the control signal on path 105.

A current sensing circuit 120 is connected in series with at least one of the outputs 116 and 118 of the power supply 108 and at least one of the electrodes of the chuck 110. In the system shown, the current sensing circuit 120 is connected in series with the output 116 and the chuck electrode 112. A separate circuit could be used for each chuck electrode to measure leakage currents to ground in the case that each electrode were driven with respect to ground. For the bipolar chuck 110 having a floating reference, the current sensing circuit 120 is used to measure the current flowing between the chuck electrodes 112 and 114. Alternatively, the current sensing circuit 120 can be internal to the power supply 108 rather than being external as depicted. As a further alternative, the current sensing circuit 120 could be incorporated into system controller 106 in lieu of a standalone circuit 120.

The current sensing circuit 120 includes threshold setting circuitry 121, a current measuring circuit 122, and a comparator 123. The current measuring circuit 122 produces a value I indicative of the current flowing to the chuck electrode 110. In a Johnsen-Rahbek chuck, a nominal current (I) generally flows between the electrodes (e.g., 0.1 milliamps). The current measuring circuit 122 is a simple current detector that produces signal I as a voltage that is proportional to the current flowing to the electrode. The threshold setting circuit 121 allows the operator to set a first threshold value $I_1$ (that is substantially greater than I) and a second threshold value $I_2$ (that is equal to or slightly greater than I) for comparison to the current measured by the current sensing circuit 120. The first threshold current should be greater than zero and less than about 6 milliamps depending on the type of chuck, e.g., less than a current level that would indicate chuck failure of a 200 mm (8 inch) ceramic electrostatic chuck. The second threshold value should be less than the first, e.g., a current level to indicate that the chuck is clean and operating normally, but slightly higher than the nominal current level I. As such, the chuck would be deemed clean when the cleaning process has cleaned the chuck to a cleanliness that allows the chuck to function properly, e.g., a current that approximates the nominal current of a new chuck $I_n$.

A comparator 123 within the current sensing circuit 120 compares the measured current I to $I_1$ and provides an output signal. The comparator 123 provides an "OK" signal $S_1$ when the measured current I is less than the first threshold value $I_1$, a "Clean the Chuck" signal $S_2$ when the measured current I exceeds the first threshold value $I_1$, a "Clean Succeeded" signal $S_3$ when the measured current I is below the second threshold value $I_2$ and a "Clean Failed" signal $S_4$ when the measured current I is above the second threshold value $I_2$ after cleaning. Such signals could be simple analog voltages that are proportional to the measured current, digital signals or even optical signals suitable for transmission by fiber optics.

The signal (or signals) from the comparator 123 is coupled to the system controller 106 through the support circuits 154. The system controller 106 then displays an appropriate message on display device 107. If the current measured by the current sensing circuit 120 is greater than the first threshold value $I_1$, a "Clean the Chuck" signal $S_2$ from the current sensing circuit 120 signals the system controller 106 to display a "Clean the Chuck" message to the operator at the display device 107. If, after cleaning, the current measured by the current sensing circuit 120 is below the second threshold value $I_2$, a "Clean Succeeded" signal $S_3$ from the current sensing circuit 120 signals the system controller 106 to display a "Clean Succeeded" message at the display device 107. If, after cleaning, the current measured by the current sensing circuit 120 is above the second threshold value $I_2$, a "Clean Failed" signal $S_4$ from the signal output 120 signals the system controller 106 to display a "Clean Failed" message at the display device 107. The nature of the messages at on display device 107 is dependent upon the type of display device used.

Figure 2:
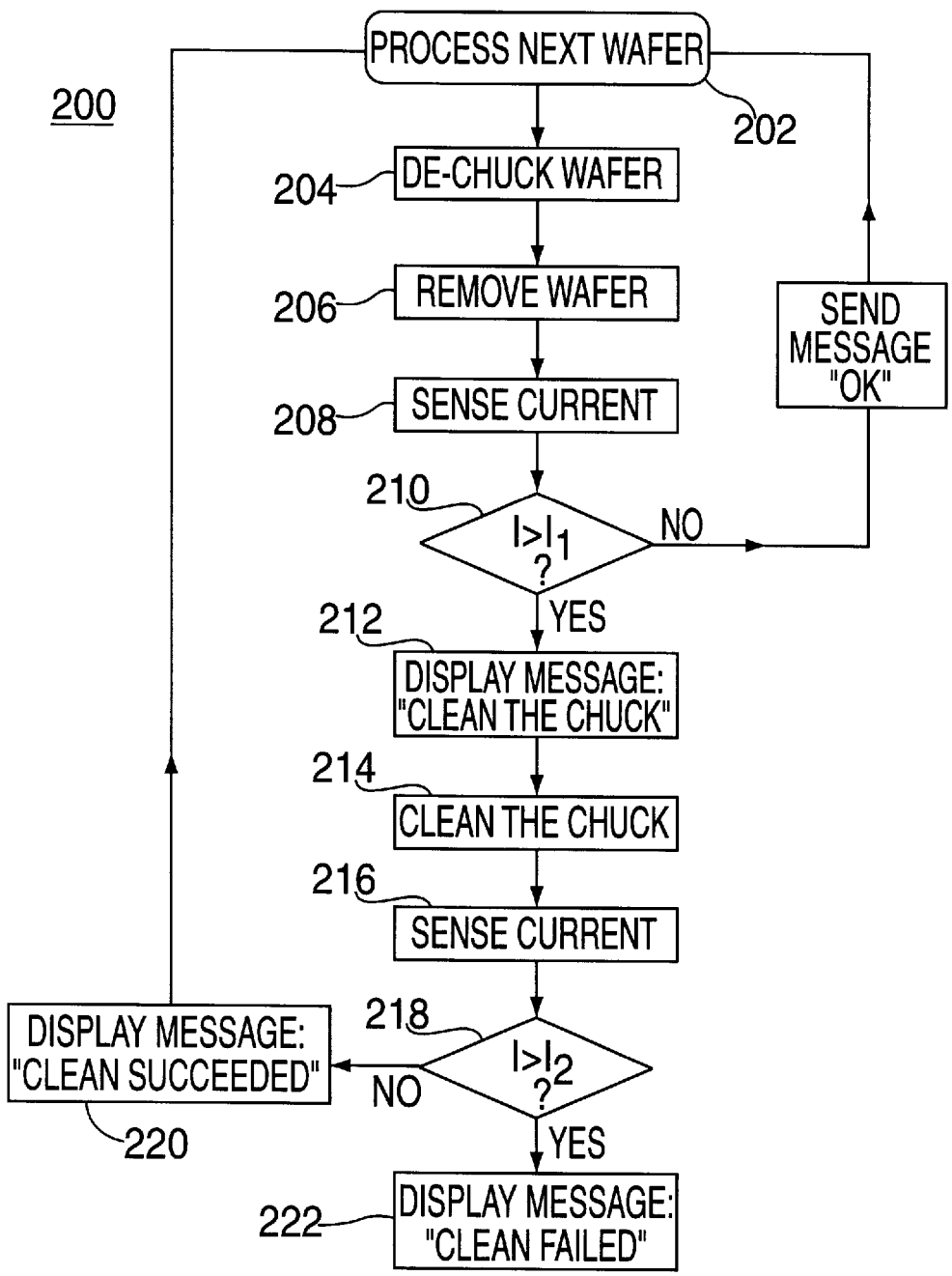
FIG. 2 depicts a flow diagram describing the sequence of operation of the semiconductor processing system of FIG. 1 in accordance with the present invention.

The method of operation of the invention is best understood in terms of the flow diagram depicted in FIG. 2. The method 200 begins at step 202 with the processing of a wafer in the process chamber. During this process, the wafer is held in place by the chuck 110. Next, in step 204, the wafer is de-chucked by means that are well known in the art and removed in step 206 for further processing in other chambers. In step 208, without a wafer on the chuck, the system controller 106 sends a control signal on path 105 to the power supply 108 to apply a first chucking voltage between the electrodes 112 and 114 while the current sensing circuit 120 makes a first measurement of the current I that flows between the electrodes 112 and 114.

In step 210, the comparator 123 compares the measured current I to the first threshold value $I_1$. If the current I measured in step 208 is less than the first threshold value $I_1$, the current sensing circuit 120 sends an "OK" signal $S_1$ to the system controller 106 in step 211. The next wafer is processed normally in step 202 and the process reiterates. If, at step 210, the measured current I exceeds the first threshold value $I_1$, the comparator 123 sends a signal to the system controller 106. System controller 106 then causes a "Clean the Chuck" warning to be displayed at the display device 107 in step 212. The operator then initiates the plasma cleaning sequence of step 214. Generally, such plasma cleaning processes ignite a plasma of Argon, Hydrogen, or Nitrogen in the chamber to remove (etch) contaminants from the surface of the chuck 110. See, for example, U.S. Pat. Nos. 5,221,450, issued Jun. 22, 1993 and 5,507,874, issued Apr. 16, 1996 both of which are incorporated herein by reference, Next, in step 216, the system controller 106 again signals the power supply 108 to apply a second chucking voltage between the electrodes 112 and 114 and the current sensing circuit 120 makes a second measurement of the current between the electrodes 112 and 114. In step 218, if the measured current I is less than the second threshold value $I_2$, the current sensing circuit 120 sends a "Clean Succeeded" signal $S_3$ to the system controller 106. The system controller 106 then causes a "Clean Succeeded" message to be displayed at the display device 107 in step 220. The next wafer is then processed normally in step 202 and the process reiterates. If the measured current I is greater than the second threshold value $I_2$, the current sensing circuit 120 sends a "Clean Failed" signal $S_4$ to the system controller 106 in step 222. The system controller 106 then causes a "Clean Failed" message to be displayed at the display device 107.

Figure 3:
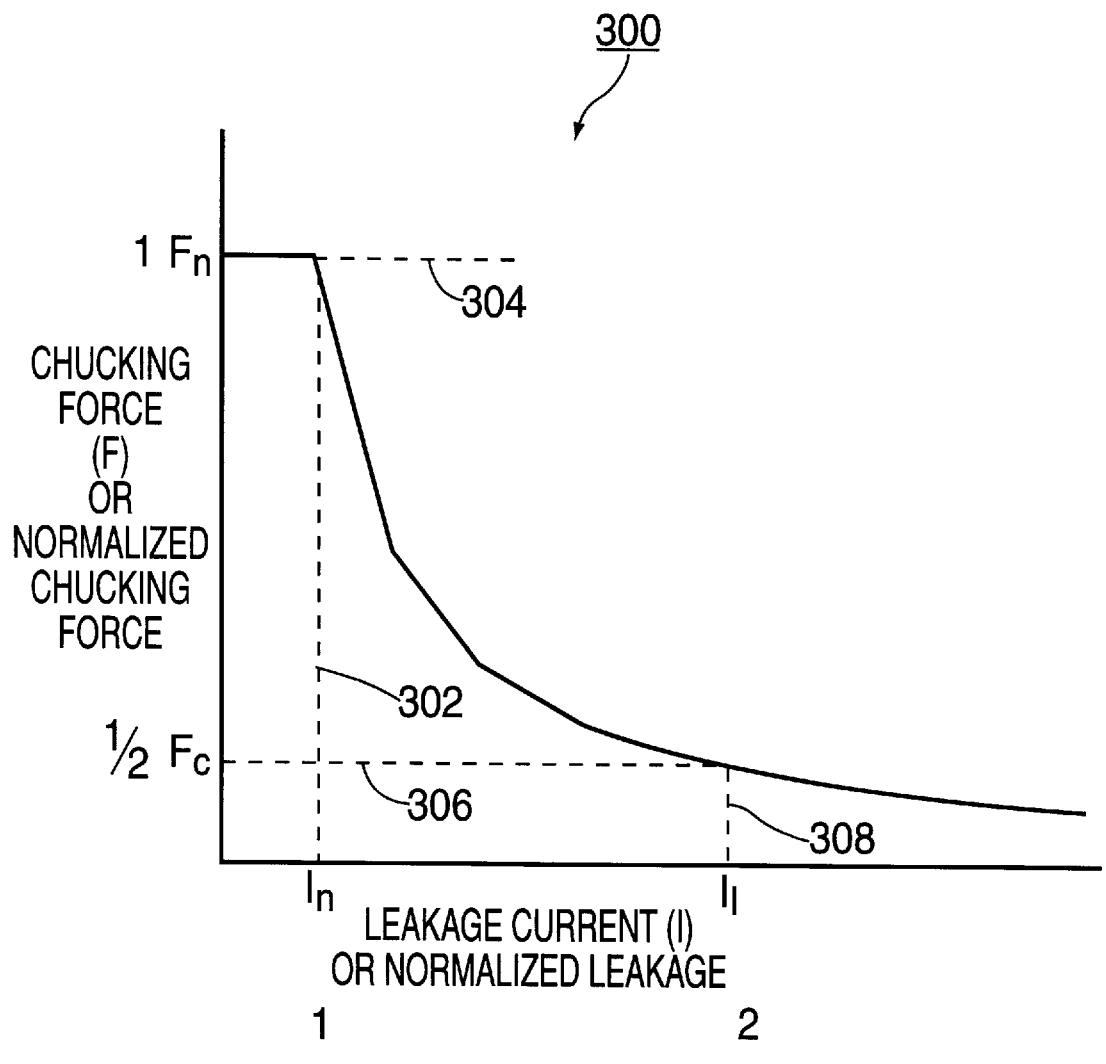
FIG. 3 depicts a graph of the chucking force as a function of the leakage current.

The first threshold value $I_1$ should be chosen such that the "Clean the Chuck" signal $S_2$ is sent prior to failure of the chuck. Failure of the chuck occurs when the leakage current I becomes so large that the chucking force produced by the chuck 110 is insufficient to chuck a wafer. A graph 300 of chucking force F versus leakage current I, as depicted in FIG. 3, shows that the chucking force F produced by an electrostatic chuck is inversely proportional to the leakage current I. When a chucking voltage is applied to a clean chuck, there is a normal leakage current $I_n$, that has a value indicated by the first vertical line 302 and a normal chucking force $F_n$. that has a value indicated by the first horizontal line 304. As the leakage current I increases the chucking force F decreases. The "Clean the Chuck" signal $S_2$ should be sent when the chucking force F reaches a critical chucking force value $F_c$, indicated by a second horizontal line 306 corresponding to the first threshold value $I_1$ of the leakage current I indicated by a second vertical line 308.

To simplify the failure detection process, the measured current and the threshold levels can be normalized to a nominal chucking current $I_n$ that represents the current flowing through the chuck when the chuck is operating normally, i.e., a new chuck. By normalizing the currents and threshold values, a single software routine can easily be adapted to process current measurements from various chucks.

FIG. 3 contains axes that are labeled with variables for current I and force F as well as illustrative normalized values of current and force. Assuming, for example, the force to current relationship is linear, empirical data can be used to identify a critical force value $F_c$ representing a force magnitude at which the chuck is deemed inoperative or as having failed. This critical level is divided by the nominal force $F_n$ that is produced to properly chuck a wafer, i.e., the nominal force $F_n$ is produced when the chuck is drawing the nominal current $I_n$. Dividing $F_c$ by $F_n$ produces a critical fraction $F_c/F_n$. This critical fraction is used to define the first threshold level that is used to determine when the chuck is to be cleaned. Assuming that a chuck is deemed inoperative when contaminants reduce the chucking force by half, i.e., the critical fraction is ½. Under this example, the first threshold level is approximately two times the nominal current, i.e., the normalized threshold is two. As such, when a normalized measured current level attains the value of 2, the chuck will be identified as requiring a cleaning. Such a normalized threshold setting routine can be implemented in software or in hardware or both by means well known in the art. Furthermore, the normalized threshold value can be established for different chuck temperatures, e.g., at low temperatures the normalized threshold level may be 2 and at higher temperatures the level may be 2.2. A table of such levels can be established and recalled for use as necessary.

The second threshold value $I_2$ can also be determined in terms of a normalized leakage current $I/I_n$ ratio, where the ratio preferably has a value approximately equal to one for the second threshold value $I_2$ although this may be different depending on the electrode structure and the process temperature. In other words, the cleaned chuck may be allowed to have a leakage current higher than the nominal current such that the normalized second threshold is not unity, e.g., the threshold could be 1.1.

Figure 4:
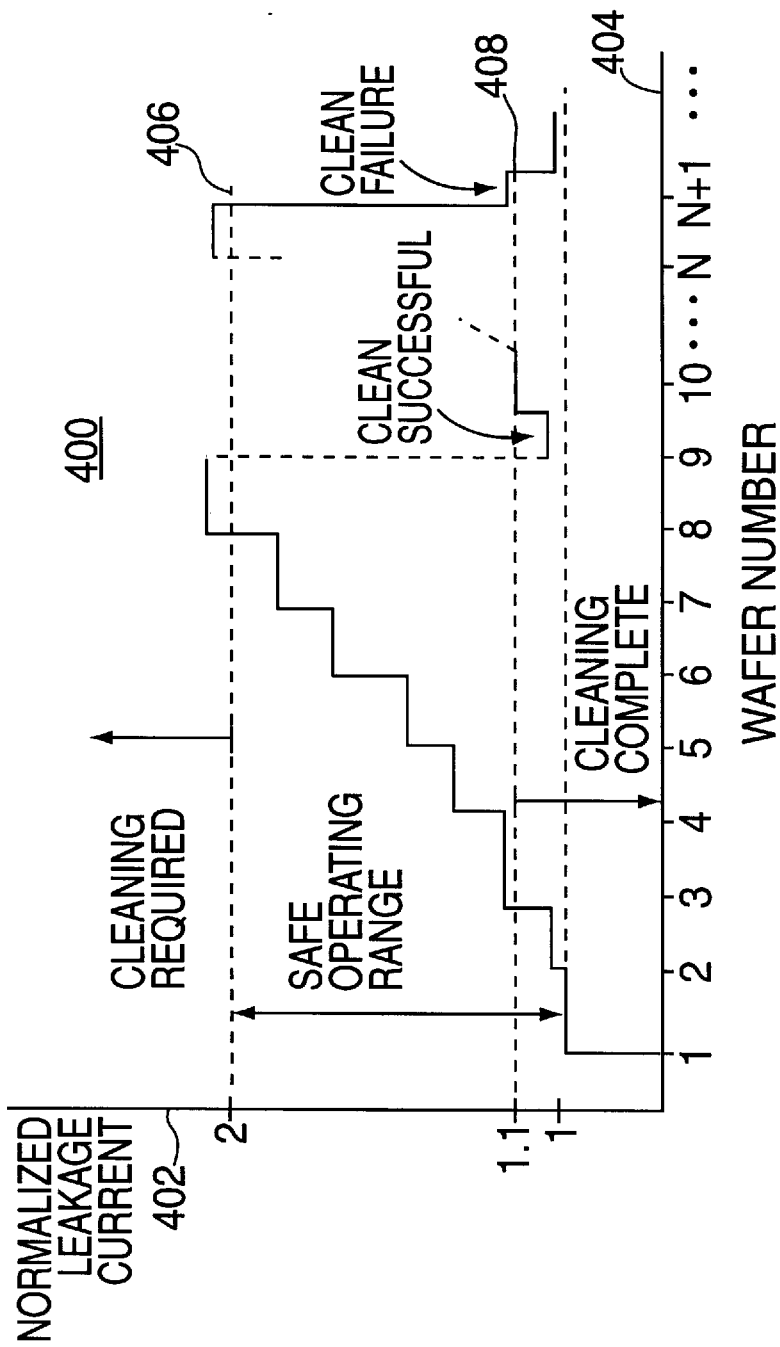
FIG. 4 depicts a graph of the normalized leakage current versus wafer number.

FIG. 4 graphically depicts an illustrative example 400 of using the normalized values within the present invention. The vertical axis 402 represents the normalized leakage current and the horizontal axis 404 represents a wafer number. The normalized threshold levels are set to 2 for cleaning (threshold 406) and 1.1 for identifying a successful cleaning threshold 408). As such, the safe operating range for the chuck is between 1 and 2 (between levels 406 and 408).

The first wafer causes the electrostatic chuck to draw a normalized current of 1. As subsequent wafers are processed and removed from the chuck, the leakage current increases until wafer 8 is complete. At that point, the normalized leakage current has crossed the cleaning required threshold 406 and the chamber performs a chuck cleaning cycle. Once cleaned, the leakage current is measured to ensure that the normalized value is less than the clean successful threshold 408, e.g., 1.1. If the cleaning was successful, the chamber will process wafer 9. If, however, the cleaning process is deemed to have failed and the leakage current is above the threshold 408, the cleaning cycle can be repeated until the chuck is deemed clean.

The present invention has the advantage of detecting contamination of the electrostatic chuck and thereby predicting failure of the chuck before such failure can occur. Once imminent failure is predicted, the chuck can be cleaned. Consequently, wafer processing is more uniform leading to higher yields, increased productivity and reduced cost per wafer.

Although various embodiments, which incorporate the teachings of the present invention, have been shown and described in detail herein, those skilled in the art can readily devise many other varied embodiments that still incorporate these teachings.

What is claimed is:

1. Apparatus for determining if an electrostatic chuck having one or more electrodes is contaminated comprising:
   a) a power supply for applying a voltage to at least one of said one or more electrodes;
   b) a current measuring circuit for measuring an electric current to said one or more electrodes wherein said current measuring circuit produces a signal responsive to said electric current; and
   c) a notification device, responsive to said signal, for indicating when said electric current exceeds a first predetermined value as an indication of electrostatic chuck contamination.

2. The apparatus of claim 1 wherein said notification device further indicates when said electric current is below a second predetermined value.

3. The apparatus of claim 2 further comprising a circuit for setting said first and second predetermined values.

4. The apparatus of claim 3 further comprising a comparator for comparing said electric current to said first and second predetermined values.

5. The apparatus of claim 1 wherein a ratio of said electric current to the first predetermined value is at least two.

6. Apparatus for determining if an electrostatic chuck, having one or more electrodes, is contaminated comprising:
   a) a system controller;
   b) a power supply, responsive to said system controller, for applying a voltage to at least one of one or more electrodes;
   c) a current measuring circuit for measuring an electric current to any of said one or more electrodes, wherein said current measuring circuit provides a signal, responsive to said electric current, to said system controller; and
   d) a notification device, responsive to said system controller, for indicating when said electric current exceeds a first predetermined value as an indication of contamination of said electrostatic chuck.

7. The apparatus of claim 6 wherein said notification device further indicates when said electric current is below a second predetermined value.

8. The apparatus of claim 7 further comprising a circuit for setting said first and second predetermined values.

9. The apparatus of claim 8 wherein said current measuring circuit further comprises a comparator for comparing said electric current to said first and second predetermined values.

10. The apparatus of claim 6 wherein said system controller comprises a programmable central processing unit.

11. A method for determining if an electrostatic chuck, having an electrode, is contaminated such that a chucking capacity of the electrostatic chuck is diminished comprising the steps of:
   a) applying a first voltage to said electrode;
   b) making a first measurement of an electric current to said electrode while applying said first voltage;
   c) comparing said first measurement to a first predetermined threshold value;
   d) generating a first signal if said first measurement is above said first predetermined threshold value to indicate that said electrostatic chuck is contaminated.

12. The method of claim 11, further comprising the step of:
   e) transmitting said first signal to a display device and displaying thereon a first message in response to said first signal.

13. The method of claim 12 wherein said first message indicates that said electrostatic chuck is contaminated and requires cleaning.

14. The method of claim 12, further comprising the step of:
   f) igniting a plasma to remove contaminants from a surface of said electrostatic chuck.

15. The method of claim 14, further comprising the steps of:
   g) applying a second voltage to said electrode;
   h) making a second measurement of a current to said electrode while applying said second voltage;
   i) comparing said second measurement to a second predetermined threshold value; and
   j) generating a second signal if said second measurement is below said second predetermined threshold value to indicate that the chuck is no longer contaminated.

16. The method of claim 15 further comprising the step of
   k) transmitting said second signal to said display device and displaying thereon a second message in response to said second signal.

17. The method of claim 16 wherein said second message indicates that said electrostatic chuck has been successfully cleaned.

18. The apparatus of claim 11 wherein said first predetermined threshold value is normalized by a nominal current measured when said electrostatic chuck is clean.

19. The apparatus of claim 18 wherein said second predetermined threshold value is normalized by a nominal current measured when said electrostatic chuck is clean.

20. The method of claim 11 wherein said first predetermined threshold value is equal to a first predetermined ratio multiplied by a normal current measured when said electrostatic chuck is clean.

21. The method of claim 15 wherein said second predetermined threshold value is normalized by a nominal current measured when said electrostatic chuck is clean.

* * * * *